(12) United States Patent
Ellis et al.

(10) Patent No.: US 10,418,413 B1
(45) Date of Patent: Sep. 17, 2019

(54) METHOD FOR MANUFACTURING A LIGHT EMITTING DIODE DISPLAY

(71) Applicant: GM Global Technology Operations LLC, Detroit, MI (US)

(72) Inventors: Susan C. Ellis, Enniskillen (CA); Jarvis Chau, Markham (CA)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 16/044,852

(22) Filed: Jul. 25, 2018

(51) Int. Cl.
| | |
|---|---|
| *H01L 27/15* | (2006.01) |
| *G02F 1/1333* | (2006.01) |
| *H01L 33/00* | (2010.01) |
| *H01L 33/42* | (2010.01) |

(52) U.S. Cl.
CPC ...... *H01L 27/156* (2013.01); *G02F 1/133305* (2013.01); *H01L 33/005* (2013.01); *H01L 33/42* (2013.01)

(58) Field of Classification Search
CPC ..... H01L 27/156; H01L 33/005; H01L 33/42; G02F 1/133305
See application file for complete search history.

(56) References Cited

PUBLICATIONS https://www.youtube.com/watch?v=y1pCkKoBHwl , High Speed LED placement, AIMTRON Corporation.
https://www.youtube.com/watch?v=Y45COU2LdXg , LED Pick & Place Machine Model EML 61D.
https://www.youtube.com/watch?v=NT3UXHwKlnA, Automatic motif machine.
https://www.youtube.com/watch?v=AlwF1Hg65mg , Soldering robot.

*Primary Examiner* — William Coleman

(57) ABSTRACT

A method for manufacturing a light emitting diode (LED) display includes providing a template having keyed holes disposed in the template, depositing keyed LED's onto the template manipulating the keyed LED's such that each of the keyed LED's fits within a corresponding keyed hole in the template, and transferring the keyed LED's onto a circuit board.

20 Claims, 4 Drawing Sheets

METHOD FOR MANUFACTURING A LIGHT EMITTING DIODE DISPLAY

INTRODUCTION

The present disclosure relates to manufacturing a light emitting diode (LED) display that orients the LED's in a particular configuration.

LED displays, including flexible LED displays that include a matrix of LED's or mini-LED's or micro-LED's on a large flexible circuit board, are useful in a wide variety of applications where dynamic lighting and imaging are desired. These LED displays include a very large quantity (2 k+per area of display) of LED's that must be attached to the circuit board in a specific orientation and location such that each LED is connected to power and control. Conventionally, these LED displays have been manufactured using 'pick and place' automation where each individual LED is picked up and placed on the circuit board.

While effective for its intended purpose, there is a need in the art for a method of manufacturing LED displays that is simpler, faster, more cost efficient, and similarly reliable as the conventional 'pick and place' method.

SUMMARY

According to several aspects, a method for manufacturing a light emitting diode (LED) display includes providing a template having keyed holes disposed in the template, depositing keyed LED's into the template manipulating the keyed LED's such that each of the keyed LED's fits within a corresponding keyed hole in the template, and transferring the keyed LED's onto a circuit board.

In one aspect, the keyed LED's include a keyed feature that mates with a keyed shape formed in the keyed holes of the template to align the keyed LED's in a particular direction.

In another aspect, the circuit board includes a substrate of partitioned transparent conductive film with alternating cathode strip coatings and anode strip coatings.

In another aspect, the partitioned transparent conductive film with a layer of indium tin oxide, FTO, or other conductive coating.

In another aspect, the particular direction of the keyed LED's aligns a cathode contact on the keyed LED's with the cathode strip and aligns an anode contact on the keyed LED's with the anode strip.

In another aspect, the keyed LED's include a pre-tin deposit at each of the cathode contacts and the anode contacts.

In another aspect, transferring the keyed LED's onto the circuit board includes aligning the circuit board with the template, applying pressure to the circuit board and the template, and heating the circuit board and the template such that the pre-tin deposits melt onto the circuit board to bond the keyed LED's onto the circuit board.

In another aspect, transferring the keyed LED's onto the circuit board includes aligning the circuit board with the template, applying a pre-tin deposit at each of the cathode contacts and the anode contacts of the keyed LED's, applying pressure to the circuit board and the template, and heating the circuit board and the template such that the pre-tin deposits melt onto the circuit board.

In another aspect, transferring the keyed LED's onto the circuit board includes aligning the circuit board with the template and applying a solder paste to the cathode contacts and the anode contacts and to the circuit board.

In another aspect, the circuit board is an etched or printed circuit on a transparent conductive film.

In another aspect, the particular direction of the keyed LED's aligns a cathode contact on the keyed LED's with the etched or printed circuit and aligns an anode contact on the keyed LED's with etched or printed circuit to form a complete electrical circuit through the keyed LED's.

In another aspect, the keyed LED's include a pre-tin deposit at each of the cathode contacts and the anode contacts and transferring the keyed LED's onto the circuit board includes aligning the circuit board with the template, applying pressure to the circuit board and the template, and heating the circuit board and the template such that the pre-tin deposits melt onto the circuit board.

In another aspect, transferring the keyed LED's onto the circuit board includes aligning the circuit board with the template, applying a pre-tin deposit at each of the cathode contacts and the anode contacts of the keyed LED's, applying pressure to the circuit board and the template, and heating the circuit board and the template such that the pre-tin deposits melt onto the circuit board.

In another aspect, the keyed LED's onto the circuit board includes aligning the circuit board with the template and soldering the cathode contacts and the anode contacts to the circuit board.

In another aspect, the template is a flexible template and the circuit board is a flexible circuit board.

In another aspect, depositing the keyed LED's onto the template includes placing the keyed LED's into a hopper disposed over the template, and agitating the LED's in the hopper such that they fall onto the template.

In another aspect, manipulating the keyed LED's such that each of the keyed LED's fits within a corresponding keyed hole in the template includes brushing or sweeping the keyed LED's on the template such that each keyed LED is moved to fit within a keyed hole and excess keyed LED's are removed.

According to several other aspects, a method for manufacturing a light emitting diode (LED) display includes providing a template having holes disposed in the template, each hole having a keyed element formed therein, providing LED's, each LED having a keyed feature sized to fit within the keyed element of the holes in the template, depositing the LED's onto the template, manipulating the LED's such that each of the LED's fits within a corresponding hole in the template in a particular orientation based on the keyed feature of the LED fitting within the keyed element of the hole, and transferring the keyed LED's onto a circuit board.

In one aspect, providing LED's includes providing each LED with a housing that houses a light element, an anode contact connected with the light element, a cathode contact connected with the light element, and a lens disposed over the light element, wherein the keyed feature is formed in the housing or lens such that the LED is not symmetrical about at least one axis.

According to several other aspects, a method for manufacturing a light emitting diode (LED) display includes providing a template having keyed holes disposed in the template, depositing keyed LED's onto the template, manipulating the keyed LED's such that each of the keyed LED's fits within a corresponding keyed hole in the template and each keyed LED has an orientation, aligning a circuit board with the template having the keyed LED's based on the orientation, applying pressure to the circuit board and the template, and heating the circuit board and the template such that pre-tin deposits melt onto the circuit board and connect the LED's to the circuit board.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

With reference to the figures generally, a method for manufacturing an LED display is shown and described. The method provides for the mass-transfer of LED's onto a circuit board to form an LED display. The LED display may then be used or incorporated by itself or with other LED displays into any number of embodiments, including motor vehicle paneling, glass windows, curved surfaces or trim pieces, flexible panels, etc. The method orients each LED in a specific way to match the circuit design of the circuit board to assure that each LED is powered, as will be described below.

Figure 1:
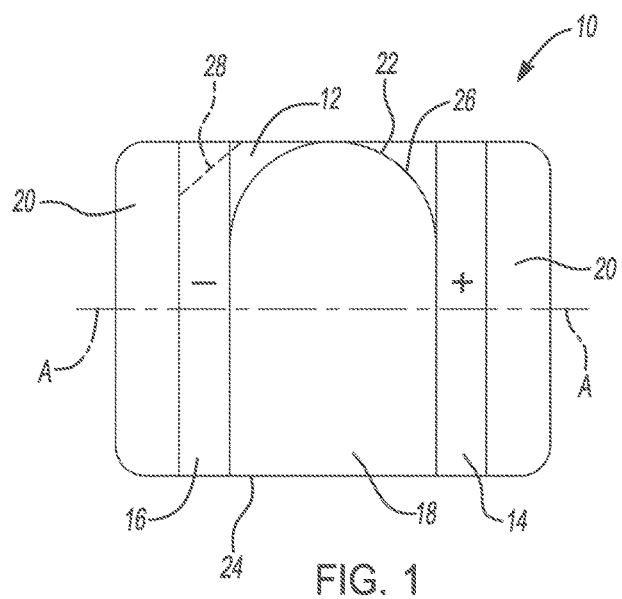
FIG. 1 is a top view of an exemplary LED used in a method for manufacturing an LED display.
Figure 2:
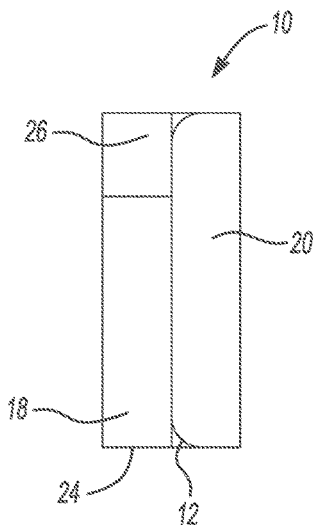
FIG. 2 is a side view of the exemplary LED.
Figure 3:
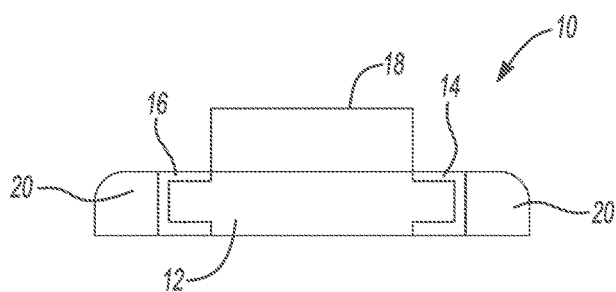
FIG. 3 is an end view of the exemplary LED.

Referring now to FIGS. 1-3, an exemplary keyed LED used in the method of the present disclosure is generally indicated by reference number 10. The keyed LED 10 may have various shapes, sizes, and designs so long as the keyed LED incorporates a keyed feature. For example, the keyed LED 10 may be a small sized or mini LED (2020, 5050) and may have any number of contacts including 2 contacts, 4 contacts, etc. In the example provided, the keyed LED 10 is a 2-contact mini LED. The keyed LED 10 includes a housing 12 that houses a light emitter, such as a p-n junction diode (not shown), that is connected to an anode, indicated schematically in the drawings with a "+", and a cathode, indicated schematically in the drawings with a "−". An anode contact pad 14 is disposed on one side of the housing 12 and a cathode contact pad 16 is disposed on an opposite side of the housing 12. A transparent lens 18 is disposed overtop the housing 12. In one example, the keyed LED 10 includes pre-tin deposits 20 disposed at each of the anode contact pad 14 and the cathode contact pad 16. In another example, the keyed LED 10 does not include the pre-tin deposits 20.

As noted above, the keyed LED 10 includes a keyed feature 22 formed therein such that the keyed LED 10 is not symmetrical about a transverse axis "A-A". In the example provided, the keyed feature 22 is formed in the lens 18 as a cut out from the lens 18. Thus, the lens 18 has a planar first end 24 and a curved second end 26 that forms the keyed feature 22. In another example, the keyed feature 22 may be formed in the housing 12 where a portion of the housing 12 is removed, indicated by dashed line 28, such that the housing 12 is not symmetrical about the transverse axis A-A.

Figure 4:
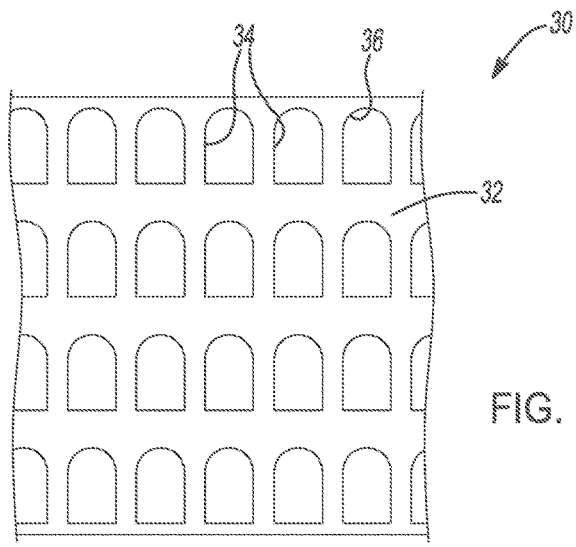
FIG. 4 is a top view of a portion of an exemplary template used in the method.

Turning to FIG. 4, a portion of an exemplary template is generally indicated by reference number 30. The template 30 functions to specifically orient a plurality of the keyed LED's 10 during the manufacturing method described below. The template 30 may be a continuous flexible roll or be a series of discrete plates. The template 30 includes a substrate 32. A plurality of keyed holes 34 are formed in the substrate 32. Each keyed hole 34 includes a keyed shape 36 that matches the keyed feature 22 of the keyed LED 10. Thus, in the example provided, the keyed hole 34 matches the shape of the lens 18.

Figure 5:
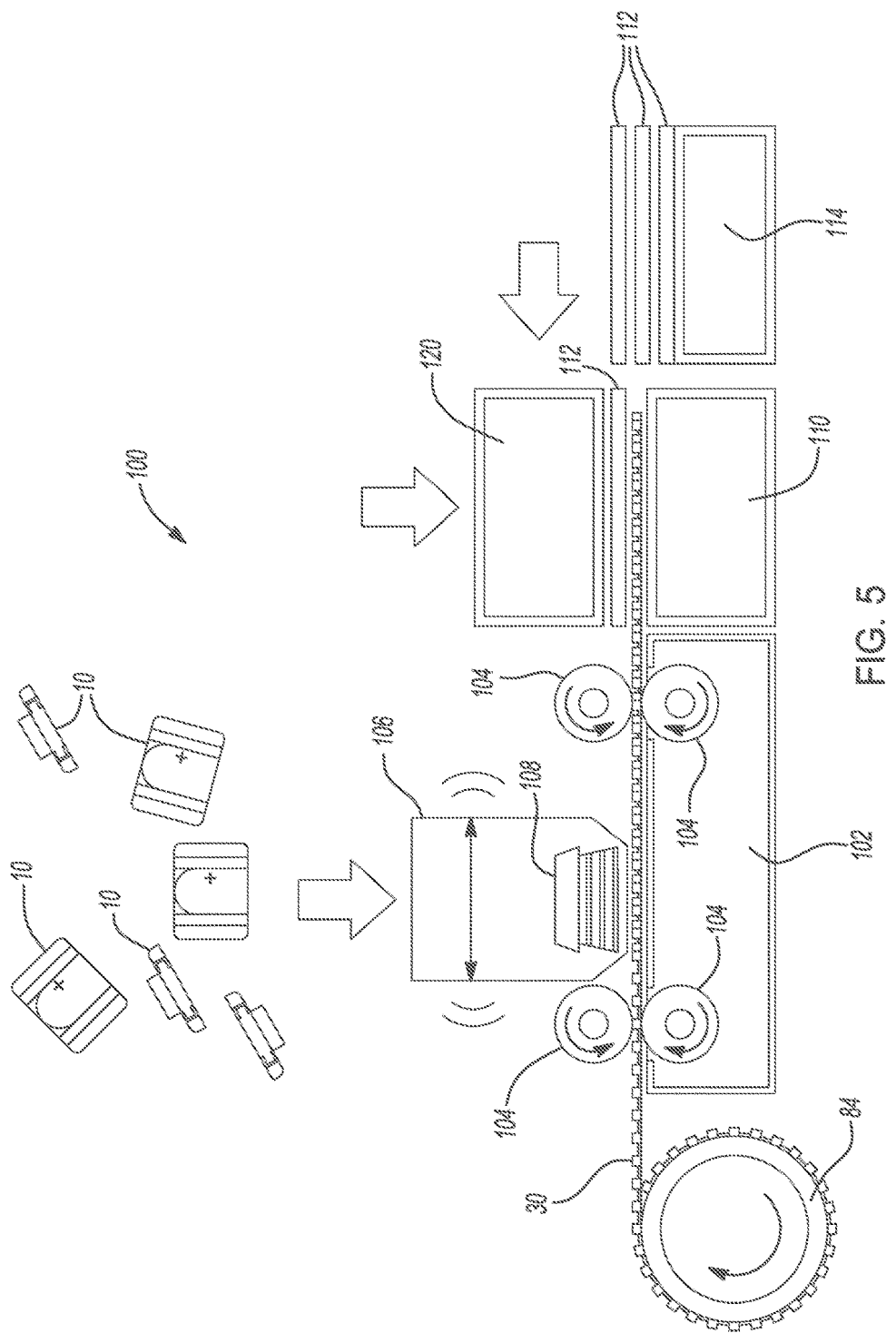
FIG. 5 is a schematic view of the method for manufacturing the LED display.

Referring to FIG. 5, and with continued reference to FIGS. 1-4, an illustration of a method of manufacturing an LED display is generally indicated by reference number 100. First, the template 30 is provided and moved across a template table 102 or other suitable substrate or conveyor system by rotating disks, wheels, or drums 104, or any other suitable mechanism. Disposed over the template table 102 is a hopper 106. The keyed LED's 10 are disposed in bulk within the hopper 106. Next, the keyed LED's 10 are deposited onto the template 30. In one example, gravity feeds the keyed LED's 10 onto the template 30. In another example, the hopper 106 is shaken, vibrated, or otherwise agitated to facilitate deposition of the keyed LED's 10 onto or into the template 30. Next, the keyed LED's 10 are manipulated such that each keyed LED 10 is made to fit within a corresponding keyed hole 34 in the template 30. For example, a brush 108 is used to physically move the keyed LED's 10 such that they fall within the keyed holes 34 of the template 30.

Figure 6:
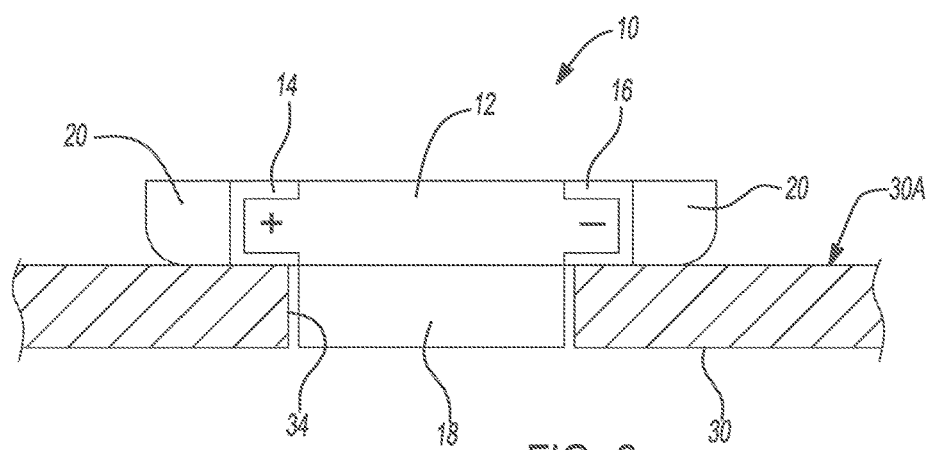
FIG. 6 is a side cross-sectional view of the exemplary LED disposed in the exemplary template.

Due to the keyed features 22 of the keyed LED's 10 and the keyed shapes 36 of the template 30, the keyed LED's 10 are oriented in a specific configuration relative to the template 30. Turning briefly to FIG. 6, one of the keyed LED's 10 is shown disposed within a keyed hole 34 of the template 30. In this example, the lens 18 fits within the keyed hole 34 while the housing 12, the anode contact pad 14, the cathode contact pad 16, and the pre-tin deposits 20 are disposed on an outer surface 30A of the template 30.

Figure 7:
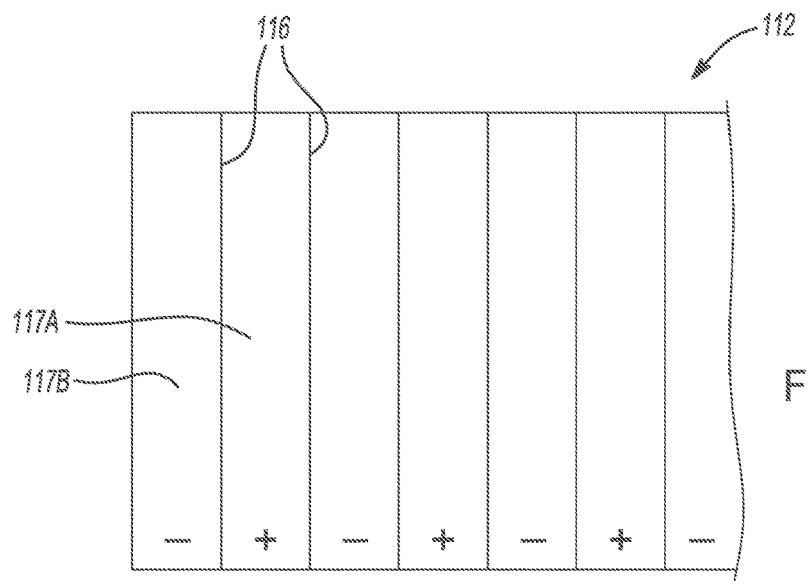
FIG. 7 is a top view of a first circuit board.
Figure 8:
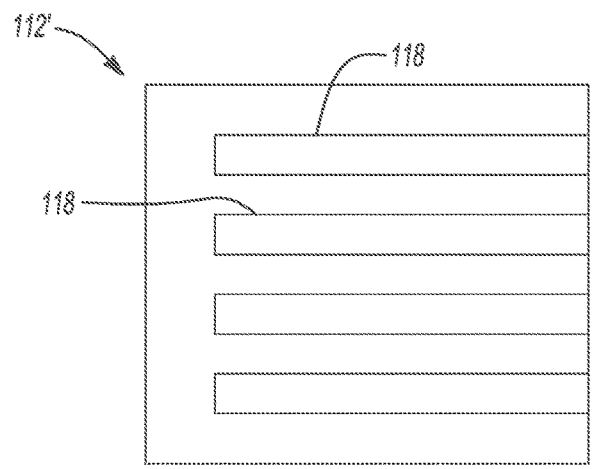
FIG. 8 is a top view of a second circuit board.

Once the template 30 has been filled with keyed LED's 10, the template 30 moves to a transfer table 110. At the transfer table 110, a circuit board 112 is placed overtop the template 30 and keyed LED's 10 by a circuit board feed 114. Turning briefly to FIG. 7, in one example the circuit board 112 is a partitioned transparent conductive film having a layer of indium tin oxide, FTO, or other conductive coating, with trace scores 116 that divide the film into anode strip coatings 117A and cathode strip coatings 117B. Turning to FIG. 8, an alternate embodiment of a circuit board 112' is shown. The circuit board 112' includes an etched or printed circuit 118 disposed on a transparent substrate. In both the circuit boards 112, 112', the keyed LED's 10 must be oriented in a particular configuration in order to match the anode and cathode contact pads 14, 16 with the proper anode and cathode circuits or strips of the circuit board 112, 112'.

Figure 9:
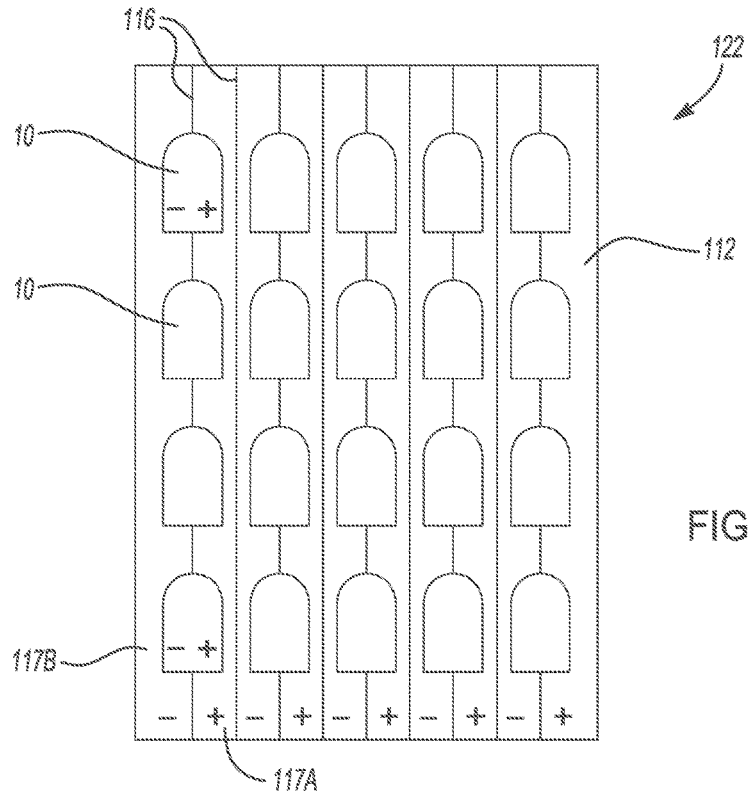
FIG. 9 is a top view of the LED display used with the first circuit board.
Figure 10:
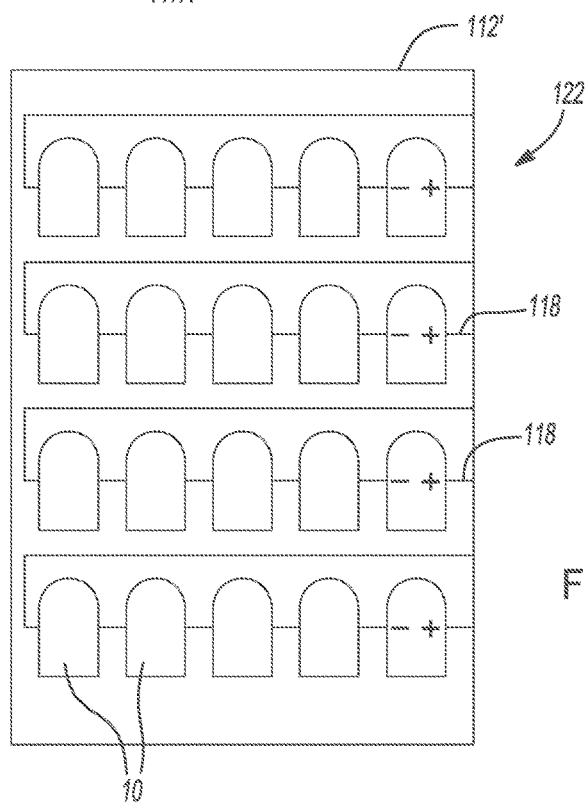
FIG. 10 is a top view of the LED display used with the second circuit board.

Returning to FIG. 5, once the circuit board 112, 112' has been placed overtop the outer surface 30A of the template 30, heat and pressure are applied by a suitable device, such as an autoclave 120. The pre-tin deposits 20 melt and secure the keyed LED's 10 to the circuit board 112, 112' in the configuration defined by the template 30 to create an LED display 122 using circuit board 112, shown in FIG. 9, or an LED display 122' using circuit board 112', shown in FIG. 10. In other embodiments, the pre-tin deposits 20 may be placed directly on the circuit board 112, 112' rather than the keyed LED's 10. In still other embodiments, the keyed LED's 10 may be soldered onto the circuit board 112, 112'. The melted pre-tin deposits 20 electrically couple the keyed LED's 10 with the anode strips 117A, cathode strips 117B, or the circuit 118. The LED display 122, 122' may be then removed as a section and used in other processes, such as lamination, or directly coupled to a powered circuit to provide power to the anode and cathode strips 117A, 117B or the circuit 118, thereby providing power to the keyed LED's 10. The template 30 may be recycled back into the method 100 or kept with the LED displays 122, 122'.

The method of manufacturing the LED displays of the present disclosure offers several advantages. These include increased speed, decreased cost, adaptability of the equipment for next generation vehicles and windows, reliable LED orientation, the ability to create complex curved surfaces, non-rectangular trim edges, the ability to transfer LED's in bulk in any desired pattern to create circuits on any desired circuit board configuration, and providing a display suitable for lamination.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A method for manufacturing a light emitting diode (LED) display or lighting comprising:
   providing a template having keyed holes disposed in the template;
   depositing keyed LED's onto the template;
   manipulating the keyed LED's such that each of the keyed LED's fits within a corresponding keyed hole in the template; and
   transferring the keyed LED's onto a circuit board.

2. The method of claim 1 wherein the keyed LED's include a keyed feature that mates with a keyed shape formed in the keyed holes of the template to align the keyed LED's in a particular direction.

3. The method of claim 1 wherein providing the template includes providing a flexible template and wherein the circuit board is a flexible circuit board.

4. The method of claim 1 wherein depositing the keyed LED's onto the template includes:
   placing the keyed LED's into a hopper disposed over the template; and
   agitating the LED's in the hopper such that they fall onto the template.

5. The method of claim 2 wherein the circuit board includes a substrate of partitioned transparent conductive film with alternating cathode strips of conductive coating and anode strips of conductive coating.

6. The method of claim 2 wherein the circuit board is an etched or printed circuit on a transparent substrate.

7. The method of claim 4 wherein manipulating the keyed LED's such that each of the keyed LED's fits within a corresponding keyed hole in the template includes brushing or sweeping the keyed LED's on the template such that each keyed LED is moved to fit within a keyed hole and excess keyed LED's are removed.

8. The method of claim 5 wherein the partitioned transparent conductive film is comprised of a coating of indium tin oxide.

9. The method of claim 5 wherein the particular direction of the keyed LED's aligns a cathode contact on the keyed LED's with the cathode strip and aligns an anode contact on the keyed LED's with the anode strip.

10. The method of claim 9 wherein the keyed LED's include a pre-tin deposit at each of the cathode contacts and the anode contacts.

11. The method of claim 10 wherein transferring the keyed LED's onto the circuit board includes aligning the circuit board with the template, applying pressure to the circuit board and the template, and heating the circuit board and the template such that the pre-tin deposits melt and bond onto the circuit board.

12. The method of claim 6 wherein the particular direction of the keyed LED's aligns a cathode contact on the keyed LED's with the etched or printed circuit and aligns an anode contact on the keyed LED's with etched or printed circuit to form a complete electrical circuit through the keyed LED's.

13. The method of claim 9 wherein transferring the keyed LED's onto the circuit board includes aligning the circuit board with the template, applying a pre-tin deposit at each of the cathode contacts and the anode contacts of the keyed LED's, applying pressure to the circuit board and the template, and heating the circuit board and the template such that the pre-tin deposits melt onto the circuit board.

14. The method of claim 9 wherein transferring the keyed LED's onto the circuit board includes aligning the circuit board with the template and soldering the cathode contacts and the anode contacts to the circuit board.

15. The method of claim 12 wherein the keyed LED's include a pre-tin deposit at each of the cathode contacts and the anode contacts and transferring the keyed LED's onto the circuit board includes aligning the circuit board with the template, applying pressure to the circuit board and the template, and heating the circuit board and the template such that the pre-tin deposits melt onto the circuit board.

16. The method of claim 12 wherein transferring the keyed LED's onto the circuit board includes aligning the circuit board with the template, applying a pre-tin deposit at each of the cathode contacts and the anode contacts of the keyed LED's, applying pressure to the circuit board and the template, and heating the circuit board and the template such that the pre-tin deposits melt onto the circuit board.

17. The method of claim 12 wherein transferring the keyed LED's onto the circuit board includes aligning the circuit board with the template and soldering the cathode contacts and the anode contacts to the circuit board.

18. A method for manufacturing a light emitting diode (LED) display comprising:
   providing a template having holes disposed in the template, each hole having a keyed element formed therein;
   providing LED's, each LED having a keyed feature sized to fit within the keyed element of the holes in the template;
   depositing the LED's onto the template;
   manipulating the LED's such that each of the LED's fits within a corresponding hole in the template in a particular orientation based on the keyed feature of the LED fitting within the keyed element of the hole; and
   transferring the keyed LED's onto a circuit board.

19. The method of claim 18 wherein providing LED's includes providing each LED with a housing that houses a light element, an anode contact connected with the light element, a cathode contact connected with the light element, and a lens disposed over the light source, wherein the keyed feature is formed in the lens or housing such that the LED is not symmetrical about at least one axis.

20. A method for manufacturing a light emitting diode (LED) display comprising:
- providing a template having keyed holes disposed in the template;
- depositing keyed LED's onto the template;
- manipulating the keyed LED's such that each of the keyed LED's fits within a corresponding keyed hole in the template and each keyed LED has an orientation; and
- aligning a circuit board with the template having the keyed LED's based on the orientation;
- applying pressure to the circuit board and the template; and
- heating the circuit board and the template such that pre-tin deposits melt onto the circuit board and connect the LED's to the circuit board.

* * * * *